United States Patent
Aderhold et al.

(10) Patent No.: US 12,533,717 B2
(45) Date of Patent: Jan. 27, 2026

(54) PROCESS CHAMBER CLEAN

(71) Applicant: Applied Materials, Inc., Santa Clara, CA (US)

(72) Inventors: Wolfgang R. Aderhold, Cupertino, CA (US); Karthik Raman Sharma, Fremont, CA (US); Yi Wang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 18/584,218

(22) Filed: Feb. 22, 2024

(65) Prior Publication Data

US 2024/0307930 A1    Sep. 19, 2024

Related U.S. Application Data

(60) Provisional application No. 63/452,072, filed on Mar. 14, 2023.

(51) Int. Cl.
*B08B 7/00* (2006.01)
*H01L 21/67* (2006.01)
*H05B 3/00* (2006.01)

(52) U.S. Cl.
CPC ...... *B08B 7/0035* (2013.01); *H01L 21/67115* (2013.01); *H01L 21/67248* (2013.01); *H01L 21/67253* (2013.01); *H05B 3/0047* (2013.01); *H05B 2203/022* (2013.01)

(58) Field of Classification Search
None
See application file for complete search history.

(56) References Cited

U.S. PATENT DOCUMENTS

| | | | |
|---|---|---|---|
| 9,236,246 B2 | 1/2016 | Hamano et al. | |
| 2001/0027030 A1* | 10/2001 | Vasudev | H01L 21/67028 438/784 |
| 2005/0109461 A1 | 5/2005 | Sun | |
| 2005/0191044 A1* | 9/2005 | Aderhold | H01L 21/67115 219/390 |
| 2005/0279384 A1* | 12/2005 | Guidotti | C23C 16/52 156/345.1 |
| 2020/0395198 A1 | 12/2020 | Allen et al. | |
| 2022/0199376 A1 | 6/2022 | Yang et al. | |

FOREIGN PATENT DOCUMENTS

WO    2007-137035 A2    11/2007

OTHER PUBLICATIONS

International Search Report and Written Opinion dated Jun. 14, 2024 for Application No. PCT/US2024/016835.

* cited by examiner

*Primary Examiner* — Natasha N Campbell
(74) *Attorney, Agent, or Firm* — Patterson + Sheridan, LLP

(57) ABSTRACT

A method of cleaning a process chamber is provided including supplying a plasma from a remote plasma source to an interior volume of a rapid thermal processing chamber during a first time period, the rapid thermal processing chamber including a plurality of lamps configured to heat an interior volume of the rapid thermal processing chamber; and providing heat from the plurality of lamps to heat the interior volume of the rapid thermal processing chamber during the first time period when the plasma from the remote plasma source is provided to the interior volume of the rapid thermal processing chamber.

18 Claims, 3 Drawing Sheets

PROCESS CHAMBER CLEAN

RELATED APPLICATIONS

This application claims benefit of and priority to U.S. Patent Application No. 63/452,072, filed Mar. 14, 2023, the entire contents of which are incorporated herein by reference.

BACKGROUND

Embodiments of the present disclosure generally relate to methods and related equipment for cleaning a process chamber, such as a rapid thermal processing chamber.

DESCRIPTION OF THE RELATED ART

Process chambers used for processing substrates (e.g., semiconductor substrates) are generally cleaned after processing a number of substrates. Process chambers used for annealing substrates, such as rapid thermal processing chambers, are routinely cleaned due to outgassing from substrates processed inside the process chambers. The outgassing results in deposits on interior surfaces, such as quartz shields that protect the chamber walls or other components (e.g., reflector) from such deposits. Cleaning process chambers including these quartz shields includes disassembling the process chamber, so that the interior components, such as the quartz shields can be cleaned. This disassembly results in significant downtime that increases cost of production.

Accordingly, there is a need for improved methods and equipment that can reduce the downtime caused by cleaning process chambers, such as rapid thermal processing chambers used for annealing substrates.

SUMMARY

In one embodiment, a method of cleaning a process chamber is provided including: a) supplying a plasma from a remote plasma source to an interior volume of a rapid thermal processing chamber during a first time period, the rapid thermal processing chamber including a plurality of lamps configured to heat an interior volume of the rapid thermal processing chamber; and b) providing heat from the plurality of lamps to heat the interior volume of the rapid thermal processing chamber during the first time period when the plasma from the remote plasma source is provided to the interior volume of the rapid thermal processing chamber.

In another embodiment, a method of cleaning a process chamber is provided including: a) supplying one or more cleaning gases to an interior volume of a rapid thermal processing chamber during a first time period, the rapid thermal processing chamber including a plurality of lamps configured to heat an interior volume of the rapid thermal processing chamber; b) providing heat from the plurality of lamps to heat a component in the interior volume to a first temperature to generate radicals of the one or more cleaning gases in the interior volume during the first time period, wherein the first temperature is at least 500° C.; and c) stopping the supply of the one or more cleaning gases to the interior volume and providing a purge gas to the interior volume during a second time period occurring after the first time period.

In another embodiment, a method of cleaning a process chamber is provided including: a) supplying a plasma from a remote plasma source to an interior volume of a rapid thermal processing chamber during a first time period, the rapid thermal processing chamber including a plurality of lamps configured to heat an interior volume of the rapid thermal processing chamber; b) providing heat from the plurality of lamps to heat the interior volume of the rapid thermal processing chamber during the first time period when the plasma from the remote plasma source is provided to the interior volume of the rapid thermal processing chamber; c) stopping the supply of the plasma from the remote plasma source to the interior volume during a second time period and providing a purge gas to the interior volume of the rapid thermal processing chamber during the second time period occurring after the first time period; d) supplying one or more cleaning gases to an interior volume of the rapid thermal processing chamber during a third time period; e) providing heat from the plurality of lamps to heat a component in the interior volume to a second temperature to generate radicals of the one or more cleaning gases during the third time period, wherein the second temperature is at least 500° C.; and f) stopping the supply of the one or more cleaning gases to the interior volume and providing a purge gas to the interior volume during a fourth time period occurring after the third time period.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a rapid thermal processing (RTP) system configured to perform automated self-cleaning processes on the RTP chamber(s) included in the RTP system. The self-cleaning processes provided in this disclosure include using a plasma provided from a remote plasma source to clean the interior of the RTP chamber as well as generating plasma species (e.g., radicals) by heating gases in the interior volume of the RTP chamber to a high temperature (e.g., greater than 500° C.). The plasma provided from the remote plasma source and the plasma species generated by heating the gases provided to the interior volume of the RTP chamber can remove deposits formed on surfaces of components in the interior volume of the RTP chamber. Using the methods disclosed herein, the interior of RTP chambers can be cleaned without the use of conventional methods for cleaning the interior of RTP chambers, which include disassembly of the RTP chamber and extensive downtime. Furthermore, because methods disclosed herein can allow the interior of the RTP chambers to be maintained at a higher level of cleanliness, the quartz shields typically used in RTP chambers can be omitted. Having less components in the interior of the RTP chamber can enable the temperature of the substrate being processed to be ramped up and down more quickly, which can increase throughput as well as enable additional processes with faster temperature changes to be performed.

Figure 1:
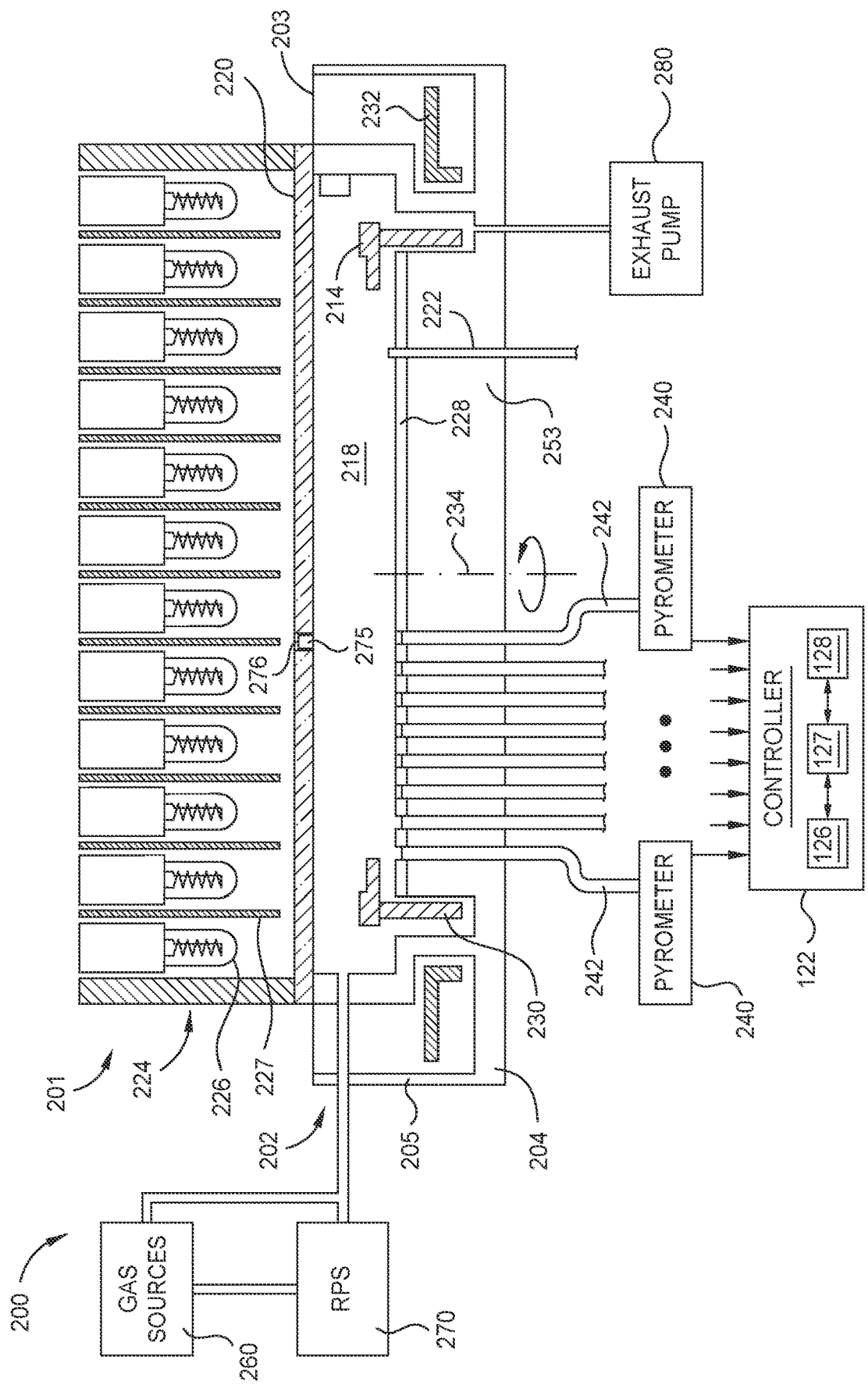
FIG. 1 shows a side cross-sectional view of a RTP chamber system, according one embodiment.

FIG. 1 shows a side cross-sectional view of a RTP chamber system 200, according one embodiment. The RTP chamber system 200 includes a RTP chamber 201, gas sources 260, a remote plasma source 270, an exhaust pump 280, and a controller 122.

In some embodiments, gases from the gas sources 260 can be provided to the remote plasma source 270 to generate a plasma that is then provided to the RTP chamber 201 to clean the interior of the RTP chamber 201. In other embodiments, gases from the gas sources 260 can be provided to the RTP chamber 201 without going through the remote plasma source 270, and these gases can be heated by the RTP chamber 201 to cause the heated gases to form plasma species (e.g., radicals) to clean the interior of the RTP chamber 201. The gases from the gas sources 260 can include cleaning gases (e.g., hydrogen and oxygen) as well as gases for performing a purge (e.g., an inert gas or nitrogen). The exhaust pump 280 can be used to exhaust gases from the interior of the RTP chamber 201 as well as to control the pressure in the interior volume of the RTP chamber 201.

The RTP chamber 201 includes a chamber body 202. The chamber body 202 encloses an interior volume 218. The chamber body 202 includes a top 203, a bottom 204, and one or more sides 205 connecting the top 203 with the bottom 204. The RTP chamber 201 includes a transparent window 220 that can form part of the top 203 of the chamber body 202.

The RTP chamber 201 includes an edge ring 214. During processing (e.g., annealing), a substrate (not shown) can be positioned on the edge ring 214 through a port (not shown) that allows access to the interior volume 218 of the RTP chamber 201. The RTP chamber 201 further includes a rotatable cylinder 230 and a rotatable flange 232. The rotatable cylinder 230 is magnetically coupled to the rotatable flange 232. A rotor (not shown) rotates the rotatable flange 232 about a central axis 234. The rotation of the flange 232 causes the rotatable cylinder 230 to rotate along with a substrate positioned on the edge ring 214 during processing.

The RTP chamber 201 further includes a reflector 228 positioned below the edge ring 214. The reflector 228 can be used to reflect radiation back towards a substrate (not shown) positioned on the edge ring 214 during processing.

The RTP chamber 201 further includes a heating apparatus 224 positioned over the chamber body 202. The heating apparatus 224 can include a plurality of lamps 226. In some embodiments, the plurality of lamps 226 can be positioned in respective reflective tubes 227 that are arranged in a hexagonal close-packed array above the transparent quartz window 220. In some embodiments, the lamps 226 are high-intensity tungsten-halogen lamps. In some embodiments, the heating apparatus 224 includes hundreds or thousands of the lamps 226. The heating apparatus 224 can be configured to rapidly heat components in the interior volume 218 at rates greater than 100° C./second, such as greater than 300° C./second, to temperatures from 600° C. to 1350° C. In some embodiments, the interior volume 218 can be less than 10,000 cm³, such as less than 5,000 cm³. These relatively small internal volumes can aid in allowing the heating apparatus 224 heat components in the interior volume at rates greater than 100° C./second, such as greater than 300° C./second.

In some embodiments, the heating apparatus 224 can be configured to heat components, such as a substrate, the edge ring 214, or the reflector 228 at rates greater than 100° C./second, such as greater than 300° C./second, to temperatures from 600° C. to 1350° C. These fast heating rates can enable the RTP chamber 201 to be cleaned with short heating and purge operations with some heating operations lasting between about one second to about ten seconds, such as about five seconds, followed by purging of the RTP chamber 201. Using short heating operations (e.g., five seconds) followed by purging of the RTP chamber 201 can help prevent redeposition of material removed by the heating and plasma species (e.g., radicals) in the interior volume 218 of the RTP chamber 201. Furthermore, these fast heating rates and high temperatures (e.g., heating rates greater than 300° C./second to a temperature of 1350° C.) can enable steam to be generated in the interior volume 218, for example by contact with a hot edge ring 214, when hydrogen and oxygen are provided to the interior volume 218 during the heating operations. This generated steam can assist in removing deposits formed on components in the interior volume 218. Additionally, in some embodiments, components configured to exhaust gases from the interior volume, such as exhaust piping or exhaust flow paths in the RTP chamber 201, can be lined with quartz to prevent redeposition of materials removed from the interior volume 218, which can prevent these materials from reentering the interior volume 218 of the RTP chamber.

During processing, the reflector 228 reflects radiation emitted from the substrate (not shown) back toward the substrate. In some embodiments, the reflector 228 can be supported on a base 253. The base 253 can form part of the chamber bottom 204. In some embodiments, the base 253 can be made of metal to heat sink excess radiation, especially during cool down portions of a process. In some embodiments, a cooling fluid (e.g., water) can be circulated through the base 253 during a process performed on a substrate. For the cleaning processes described in this disclosure, cooling fluid may or may not be circulated through the base 253.

In some embodiments, the lamps 226 can be arranged in a ring-like pattern about the central axis 234. Control circuitry can be used to vary the voltage delivered to the lamps 226 in the different zones to control the radial distribution of radiant energy during processes, so that the temperature of different locations on the substrate or other components, such as the reflector 228 can be controlled during a process.

The RTP chamber 201 can further include a plurality of pyrometers 240 and a plurality of light pipes 242. Each light pipe 242 can extend from one of the pyrometers 240 to a location below the edge ring 214. For example, each light pipe 242 can extend to a different aperture in the reflector 228. Each pyrometer 240 can receive radiation through a corresponding light pipe 242 to monitor temperatures at different locations (e.g., different radial locations) on the substrate during processing.

The RTP chamber 201 can further include a temperature sensor 222 to measure a temperature of the reflector 228 during processes, such as cleaning processes. In some embodiments, the temperature sensor 222 can be a thermocouple. Although only one temperature sensor 222 is shown, in some embodiments two or more temperature sensors can be used. Furthermore, although the temperature sensor 222 is positioned to measure a temperature of the reflector 228, in some embodiments one or more temperature sensors can be positioned to measure temperatures of other components, such as the window 220, an interior wall of the chamber body 202, or the edge ring 214. In some embodiments, measurements from the temperature sensor 222 can be used to determine when a cleaning process is complete. For example, a clean reflector 228 can reflect more radiation than a dirty reflector 228 as more of the radiation is reflected instead of being absorbed by deposits adhered to the reflector 228. Thus, when a relatively constant amount of heat is provided to the interior volume 218 by the lamps, and the temperature of the reflector 228 drops by a specified amount (e.g., 0.25° C.) or below a specified temperature (first temperature) that indicates the reflector 228 has achieved an acceptable level of cleanliness, then the cleaning process can be stopped.

The RTP chamber 201 can further include a shield 276 and a reflectance sensor 275 for detecting an intensity of radiation reflected from the reflector 228. The reflectance sensor 275 is located within the shield 276, so that the reflectance sensor 275 does not detect radiation transmitted directly from the lamps 226. In one embodiment, the reflectance sensor 275 is positioned within the window 220 underlying a portion of the one of the reflective tubes 227. In other embodiments, the reflectance sensor 275 can be positioned in other locations, such as in the interior volume 218 below the window 220.

The RTP chamber system 200 further includes the controller 122 for controlling processes performed by the RTP chamber system 200. The controller 122 can be any type of controller used in an industrial setting, such as a programmable logic controller (PLC). The controller 122 includes a processor 127, a memory 126, and input/output (I/O) circuits 128. The controller 122 can further include one or more of the following components (not shown), such as one or more power supplies, clocks, communication components (e.g., network interface card), and user interfaces typically found in controllers for semiconductor equipment.

The memory 126 can include non-transitory memory. The non-transitory memory can be used to store the programs and settings described below. The memory 126 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM).

The processor 127 is configured to execute various programs stored in the memory 126, such as programs configured to execute the method 2000 described below in reference to FIG. 2 and the method 3000 described below in reference to FIG. 3 as well as other cleaning processes and process performed on substrates. During execution of these programs, the controller 122 can communicate to I/O devices (e.g., inputs, such as sensors and outputs, such as actuators) through the I/O circuits 128. For example, during execution of these programs and communication through the I/O circuits 128, the controller 122 can control outputs, such as the power provided to the lamps 226 and the position of valves to control the gases and/or plasma provided to the interior volume 218 and receive information from inputs, such as the temperature sensor 222 and the pyrometers 240. The memory 126 can further include various operational settings used to control the RTP chamber system 200. For example, the settings can include temperature setpoints and durations for different portions of the methods 2000, 3000 described below.

Figure 2:
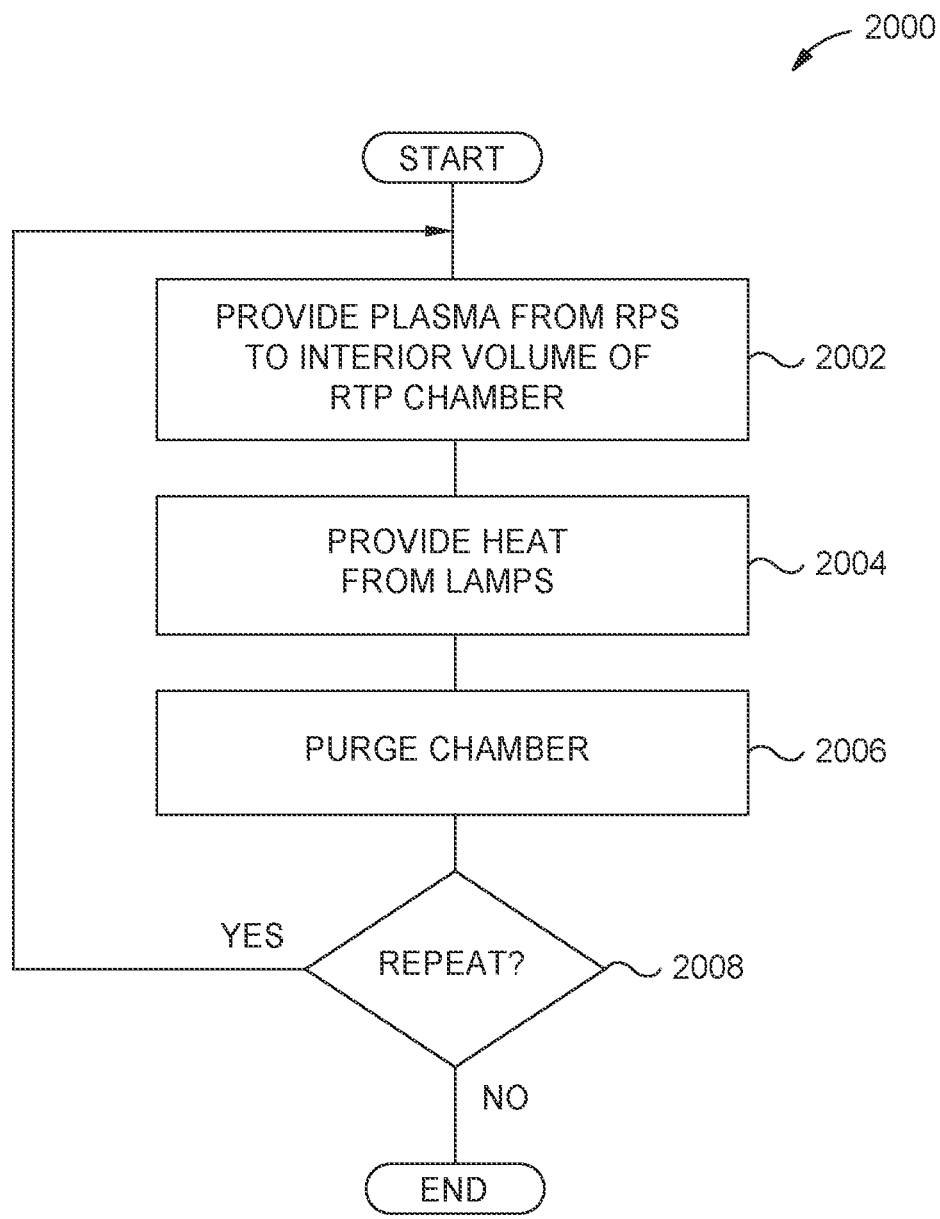
FIG. 2 is a process flow diagram of a method for cleaning the interior of the RTP chamber from FIG. 1, according to one embodiment.

FIG. 2 is a process flow diagram of a method 2000 for cleaning the interior of the RTP chamber 201 from FIG. 1, according to one embodiment.

The method begins at block 2002. At block 2002, a plasma is supplied from the remote plasma source 270 to the interior volume 218 of the RTP chamber 201. One or more gases from the gas sources 260 can be supplied to the remote plasma source 270 by opening one or more valves (not shown), and the remote plasma source 270 can generate a plasma from the supplied gases. The plasma generated in the remote plasma source 270 then flows from the remote plasma source 270 to the interior volume 218 of the RTP chamber 201. The plasma provided to the interior volume 218 can cause deposits on components in the interior volume 218, such as the reflector 228, edge ring 214, window 220, interior walls, etc., to react (e.g., forming volatile compounds) or otherwise be removed (e.g., etched) from the surface of the corresponding component. The removed deposits can then be exhausted from the interior volume 218 by the exhaust pump 280.

In one embodiment, hydrogen and oxygen are supplied to the remote plasma source 270, and the remote plasma source 270 is energized, for example with RF power, to generate plasma species of hydrogen and oxygen, such as hydrogen radicals, oxygen radicals, and hydroxyl (OH) radicals. Hydrogen and oxygen are just two examples of gases that can be provided to the remote plasma source 270, and in some embodiments other gases can be provided including gases containing nitrogen, fluoride, or chlorine.

At block 2004, heat is provided from the lamps 226 to the interior volume 218 of the RTP chamber 201. Although block 2004 is shown after block 2002 in FIG. 2, in some embodiments the heat provided from the lamps 226 can begin before or after the plasma generation of block 2002 or simultaneously with the execution of block 2002. The controller 122 can be used to control the power provided to the lamps 226 during block 2004. The heat provided by the lamps 226 can assist with removing deposits from the surfaces in the interior volume 218. In some embodiments, the heat provided by the lamps 226 at block 2004 can heat components (e.g., the reflector 228) at a rate of at least 20° C./second or at least 50° C./second. The temperature sensor 222 can be used to monitor the temperature of the reflector 228 during block 2004. The controller 122 can use the temperature measurements from the temperature sensor 222 to control the power provided to the lamps 226, so that one or more temperature setpoints can be achieved.

In some embodiments, a relatively constant level of power (i.e., the power does not fluctuate more than 1%) can be provided to the lamps during block 2004 or most of block 2004, so that the lamps 226 provide a relatively constant level of heat to the interior volume 218 during block 2004. In some embodiments, the power provided to the lamps 226 during block 2004 can be cycled between two or more levels, such as between a high power level and a low power level, for example with the high power level being at least 10% greater than the low power level. The changing power levels in these embodiments can cause the heat provided to the interior volume 218 to fluctuate, which may aid in the release of some of the deposits from the surfaces of the components in the interior volume 218.

Blocks 2002 and 2004 can be executed for a first time period that can be from about two seconds to about thirty minutes, such as from about one minute to about ten minutes. In some embodiments, using relatively short durations (e.g., less than ten seconds) for blocks 3002 and 3004 can help prevent redeposition of material removed from a component in the interior volume 218 during blocks 2002 and 2004.

At block 2006, the supply of plasma from the remote plasma source 270 to the interior volume 218 is stopped, and one or more purge gases are provided to the interior volume 218 of the rapid thermal processing chamber 201 during a second time period. The second time period occurs after the first time period during which the plasma is provided from the remote plasma source 270 and the heat is simultaneously provided from the lamps 226. The second time period can be from about ten seconds to about thirty minutes, such as from about one minute to about ten minutes. In some embodiments, the heat provided by the lamps 226 can continue during the purge of the interior volume 218 executed at block 2006. The one or more purge gases can be supplied from the gas sources 260 to the interior volume 218 of the RTP chamber 201 without going through the remote plasma source 270. The one or more purge gases can include oxygen, nitrogen and/or one or more inert gases (e.g., argon). The purge gases can help remove deposits that have released from the surfaces of the components in the interior volume 218 as well as remove volatile compounds formed from the interaction of the deposits and the plasma supplied at block 2002.

At block 2008, a determination is made to either repeat blocks 2002-2006 or to complete the method 2000. In some embodiments, the blocks 2002-2006 can be repeated a predetermined number of times (e.g., three times).

In other embodiments, feedback from one or more sensors can be used to determine whether or not to perform another cycle of blocks 2002-2006. For example, in one embodiment, measurements from the temperature sensor 222 can be used to determine whether or not to perform another cycle of blocks 2002-2006. For example, if the temperature sensor 222 detects a drop in temperature below a specified temperature (first temperature) or a temperature drop of a substantial level (e.g., at least 0.25° C. or at least 1.00° C.) on the reflector 228 for a specified duration (e.g., 5 seconds) after (1) temperature increases of the reflector 228 to a setpoint (e.g., 500° C.) and (2) without a drop in the power provided to the lamps 226 or change in gas or plasma flow, then a determination can be made that the interior volume 218 is clean enough for the method 2000 to complete. The drop in temperature measured by the temperature sensor 222 can indicate that the reflector 228 is cleaner and is reflecting more radiation from the lamps 226 instead of the deposits on the reflector 228 absorbing the radiation from the lamps 226, which result in the reflector 228 having a higher temperature.

In another embodiment, measurements from the reflectance sensor 275 can be used to determine whether or not to perform another cycle of blocks 2002-2006. For example, if the reflectance sensor 275 detects an intensity of radiation above a first intensity for a specified duration (e.g., 5 seconds), then a determination can be made that the interior volume 218 is clean enough for the method 2000 to complete. The higher intensity of the radiation can indicate that the reflector 228 has achieved a sufficient level of cleanliness and is reflecting more radiation from the lamps 226 to the reflectance sensor 275 instead of the deposits on the reflector 228 absorbing the radiation from the lamps 226.

In another embodiment, measurements from the pyrometers 240 can be used to determine whether or not to perform another cycle of blocks 2002-2006. For example, historical data from measurements performed by the pyrometers 240 can be used to identify pyrometer measurements that indicate a clean interior volume 218. In one embodiment, a cleaning process, such as the method 2000 or the method 3000 is performed on a RTP chamber that is known to already be clean (e.g., a new chamber or a RTP chamber that is otherwise confirmed to be clean). Then the measurements by the pyrometers 240 at different points (e.g., each second of a heating operation) during a cleaning process, such as the method 2000 or the method 3000, performed on the already clean RTP chamber can be used as targets for identifying a clean RTP chamber when the same cleaning process is performed on a RTP chamber that needs to be cleaned. After the pyrometer measurement targets are achieved (e.g., measurements within a specified threshold, such as within 5% or 1%) during a cleaning process, then a determination can be made by the controller 122 to end the corresponding cleaning process, for example at block 2008 in the method 2000 or block 3008 in the method 3000 described below.

Figure 3:
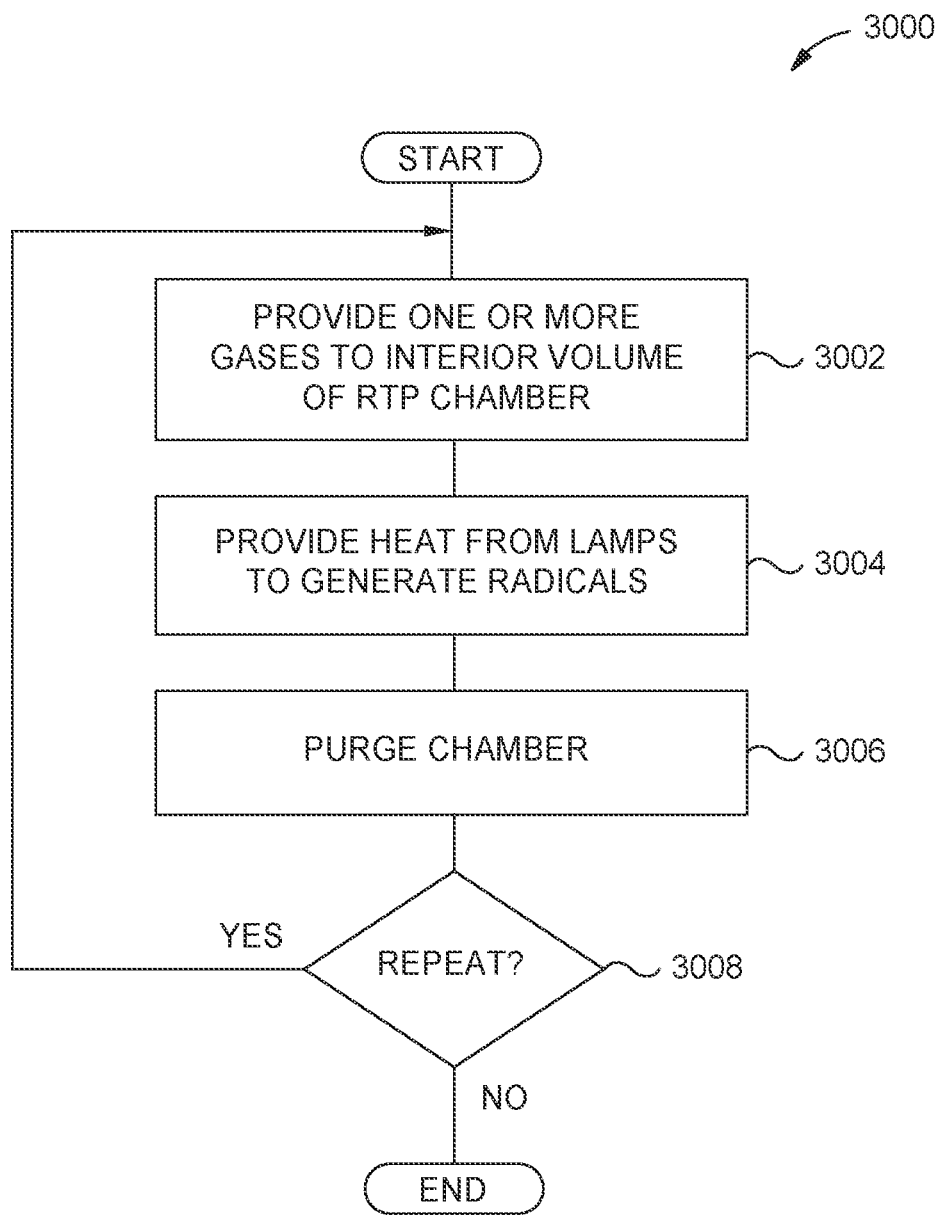
FIG. 3 is a process flow diagram of a method for cleaning the interior of the RTP chamber from FIG. 1, according to another embodiment.

FIG. 3 is a process flow diagram of a method 3000 for cleaning the interior of the RTP chamber 201 from FIG. 1, according to another embodiment.

The method begins at block 3002. At block 3002, one or more cleaning gases are provided from the gas sources 260 to the interior volume 218 of the RTP chamber 201. One or more gases from the gas sources 260 can be supplied to the interior volume 218 of the RTP chamber 201 by opening one or more valves (not shown). The one or more cleaning gases can be provided to the interior volume 218 of the RTP chamber 201 without going through the remote plasma source 270. In one embodiment, the one or more cleaning gases provided to the interior volume 218 during block 3002 can include hydrogen and oxygen. Hydrogen and oxygen are just two examples of cleaning gases that can be provided to the interior volume 218, and in some embodiments other gases can be provided including steam and gases containing nitrogen, fluoride, and/or chlorine as well as mixtures of different gases (e.g., forming gas including hydrogen and nitrogen).

At block 3004, heat is provided from the lamps 226 to the interior volume 218 of the RTP chamber 201. Although block 3004 is shown after block 3002 in FIG. 3, in some embodiments the heat provided from the lamps 226 can begin before or after block 3002 or simultaneously with the execution of block 3002. The controller 122 can be used to control the power provided to the lamps 226 during block 3004. The heat provided by the lamps 226 can generate plasma species (e.g., radicals) of the one or more cleaning gases provided to the interior volume 218, such as hydrogen radicals, oxygen radicals, and hydroxyl (OH) radicals. The generated plasma species can cause deposits on components, such as the reflector 228, edge ring 214, window 220, interior walls, etc., to react (e.g., forming a volatile compound) or otherwise be removed (e.g., etched) from the surface of the corresponding component. The removed deposits can then be exhausted from the interior volume by the exhaust pump 280.

The heat provided by the lamps 226 can also assist with removing deposits from the surfaces in the interior volume 218, for example without the assistance of the plasma species. In some embodiments, the heat provided by the lamps 226 at block 3004 can heat components (e.g., the reflector 228) at a rate of at least 20° C./second or at least 50° C./second. The temperature sensor 222 can be used to monitor the temperature of the reflector 228 during block 3004. The controller 122 can use the temperature measurements from the temperature sensor 222 to control the power provided to the lamps 226, so that one or more temperature setpoints can be achieved.

In some embodiments, a relatively constant level of power (i.e., the power does not fluctuate more than 1%) can be provided to the lamps 226 during block 3004 or most of block 3004, so that the lamps provide a relatively constant level of heat to the interior volume 218 during block 3004. In other embodiments, the power provided to the lamps 226 during block 3004 can be cycled between two or more levels, such as between a high power level and a low power level, for example with the high power level being at least 10% greater than the low power level. The changing power levels in these embodiments can cause the heat provided to the interior volume 218 to fluctuate, which may aid in the release of some of the deposits from the surfaces of the components in the interior volume 218.

Blocks 3002 and 3004 can be executed for a first time period that can be from about two seconds to about thirty minutes, such as from about one minute to about ten minutes. In some embodiments, using relatively short durations (e.g., less than ten seconds) for blocks 3002 and 3004 can help prevent redeposition of material removed from a component in the interior volume 218 during blocks 3002 and 3004.

At block 3006, the supply of the one or more gases from the gas sources 260 to the interior volume 218 is stopped, and one or more purge gases are provided to the interior volume 218 of the rapid thermal processing chamber 201 during a second time period. The second time period occurs after the first time period during which plasma species (e.g., radicals of hydrogen and oxygen) are generated from the heat provided from the lamps 226. The second time period can be from about ten seconds to about thirty minutes, such as from about one minute to about ten minutes. In some embodiments, the heat provided by the lamps 226 can continue during the purge of the interior volume 218 executed at block 3006. The one or more purge gases can be supplied from the gas sources 260 to the interior volume 218 of the RTP chamber 201 without going through the remote plasma source 270. The one or more purge gases can include oxygen, nitrogen and/or one or more inert gases (e.g., argon). The purge gases can help remove deposits that have released from the surfaces of the components in the interior volume 218 as well as remove volatile compounds formed from the interaction of the deposits and the plasma species generated at block 3004.

At block 3008, a determination is made to either repeat blocks 3002-3006 or to complete the method 3000. In some embodiments, the blocks 3002-3006 can be repeated a predetermined number of times (e.g., three times).

In other embodiments, feedback from one or more sensors can be used to determine whether or not to perform another cycle of blocks 3002-3006. For example, feedback from the temperature sensor 222, the reflectance 275, and/or the pyrometers 240 can be used in a similar manner as described above during the method 2000 for determining to execute another cycle of blocks 3002-3006.

In some embodiments, the method 2000 (see FIG. 2) and the method 3000 (see FIG. 3) can be executed in succession to clean the interior volume 218 of the RTP chamber 201. For example, each method 2000, 3000 may preferentially clean particular types of deposits or deposits on different surfaces in the interior volume 218 of the RTP chamber 201. Thus, the overall level of cleanliness of the interior volume 218 of the RTP chamber 201 can be improved by executing both of the methods 2000, 3000. In some embodiments, the method 2000 can be executed before the method 3000, and in other embodiments the method 3000 can be executed before the method 2000. Furthermore, in some embodiments each of the methods 2000, 3000 can be repeated one or more times during a process in which each of the methods 2000, 3000 are executed. In one embodiment, portions of the methods 2000, 3000 can be executed simultaneously. For example, in one embodiment plasma can be supplied to the interior volume 218 from the remote plasma source 270 (see block 2002 of FIG. 2) and plasma species (e.g., radicals of hydrogen and oxygen) can be generated in the interior volume 218 from one or more gases supplied to the interior volume 218 (see block 3002 of FIG. 3) and heat provided by the lamps 226 (see block 3004 of FIG. 3).

While the foregoing is directed to examples of the present disclosure, other and further examples of the disclosure may be devised without departing from the basic scope thereof, and the scope thereof is determined by the claims that follow.

What is claimed is:

1. A method of cleaning a process chamber comprising:
a) supplying a plasma from a remote plasma source to an interior volume of a rapid thermal processing chamber during a first time period, the rapid thermal processing chamber including a plurality of lamps configured to heat an interior volume of the rapid thermal processing chamber;
b) providing heat from the plurality of lamps to heat the interior volume of the rapid thermal processing chamber during the first time period when the plasma from the remote plasma source is provided to the interior volume of the rapid thermal processing chamber;
c) measuring an intensity of radiation reflected from a reflector in the interior volume; and
d) determining to stop the supply of the plasma from the remote plasma source when the intensity of the radiation measured increases above a first intensity.

2. The method of claim 1, further comprising:
e) stopping the supply of the plasma from the remote plasma source to the interior volume during a second time period occurring after the first time period and providing a purge gas to the interior volume of the rapid thermal processing chamber during the second time period.

3. The method of claim 2, further comprising repeating operations a), b), and e) one or more times.

4. The method of claim 2, further comprising providing heat from the lamps during the providing of the purge gas to the interior volume.

5. The method of claim 1, further comprising
measuring a temperature of a component in the interior volume during the first time period, wherein the lamps provide a relatively constant level of heat to the interior volume during the first time period; and
determining to stop the supply of the plasma from the remote plasma source when the temperature of the component drops below a first temperature during the providing of the relatively constant level of heat.

6. The method of claim 5, wherein the measuring the temperature of the component comprises measuring a temperature of a reflector.

7. The method claim 1, wherein a reflector in the interior volume is heated to a temperature of at least 500° C.

8. The method of claim 1, wherein
a power level provided to the lamps is cycled between a high power level and a low power level two or more times during the first time period, and
the high power level is at least 10% greater than the low power level.

9. A method of cleaning a process chamber comprising:
a) supplying one or more cleaning gases to an interior volume of a rapid thermal processing chamber during a first time period, the rapid thermal processing chamber including a plurality of lamps configured to heat an interior volume of the rapid thermal processing chamber;
b) providing heat from the plurality of lamps to heat a component in the interior volume to a first temperature to generate radicals of the one or more cleaning gases in the interior volume during the first time period, wherein the first temperature is at least 500° C.; and
c) stopping the supply of the one or more cleaning gases to the interior volume and providing a purge gas to the interior volume during a second time period occurring after the first time period,
wherein:
a power level provided to the lamps is cycled between a high power level and a low power level two or more times during the first time period, and
the high power level is at least 10% greater than the low power level.

10. The method of claim 9, further comprising repeating operations a) through c) one or more times.

11. The method of claim 9, further comprising providing heat from the lamps during the providing of the purge gas to the interior volume.

12. The method of claim 9, further comprising
measuring a temperature of a component in the interior volume during the first time period, wherein the lamps provide a relatively constant level of heat to the interior volume during the first time period; and
determining to stop the supply of the one or more cleaning gases when the temperature of the component drops below a first temperature during the providing of the relatively constant level of heat.

13. The method of claim 12, wherein the measuring the temperature of the component comprises measuring a temperature of a reflector.

14. The method claim 9, wherein a reflector in the interior volume is heated to a temperature of at least 500° C.

15. The method of claim 9, further comprising:
measuring an intensity of radiation reflected from a reflector in the interior volume; and
determining to stop the supply of the one or more cleaning gases to the interior volume when the intensity of the radiation measured increases above a first intensity.

16. A method of cleaning a process chamber comprising:
a) supplying a plasma from a remote plasma source to an interior volume of a rapid thermal processing chamber during a first time period, the rapid thermal processing chamber including a plurality of lamps configured to heat an interior volume of the rapid thermal processing chamber;
b) providing heat from the plurality of lamps to heat the interior volume of the rapid thermal processing chamber during the first time period when the plasma from the remote plasma source is provided to the interior volume of the rapid thermal processing chamber;
c) stopping the supply of the plasma from the remote plasma source to the interior volume during a second time period and providing a purge gas to the interior volume of the rapid thermal processing chamber during the second time period occurring after the first time period;
d) supplying one or more cleaning gases to an interior volume of the rapid thermal processing chamber during a third time period;
e) providing heat from the plurality of lamps to heat a component in the interior volume to a second temperature to generate radicals of the one or more cleaning gases during the third time period, wherein the second temperature is at least 500° C.; and
f) stopping the supply of the one or more cleaning gases to the interior volume and providing a purge gas to the interior volume during a fourth time period occurring after the third time period.

17. The method of claim 16, further comprising repeating operations a) through c) one or more times.

18. The method of claim 16, further comprising repeating operations d) through f) one or more times.

* * * * *